United States Patent [19]

Maris et al.

[11] Patent Number: 4,906,950

[45] Date of Patent: Mar. 6, 1990

[54] TIME-FREQUENCY MULTIPLEXING SYSTEM FOR CORRECTING OUTPUT AMPLITUDE OF A TUNED CIRCUIT DUE TO IMPEDANCE DRIFT

[75] Inventors: Nicholas P. Maris, Lafayette Hills; Charles Montague, Media, both of Pa.

[73] Assignee: Aeroquip Corporation, Jackson, Mich.

[21] Appl. No.: 91,611

[22] Filed: Aug. 31, 1987

[51] Int. Cl.$^4$ .............................. H03J 7/04; H03J 7/06
[52] U.S. Cl. .................................... 333/17.1; 455/125; 455/192
[58] Field of Search ................. 333/17 R, 17 M, 17.1, 333/17.3; 455/115, 120, 125, 164, 165, 173, 182, 184, 192

[56] References Cited

U.S. PATENT DOCUMENTS

| | | | |
|---|---|---|---|
| 2,991,436 | 7/1961 | Banton | 333/17 R X |
| 4,257,018 | 3/1981 | Masdea et al. | 333/17 R |
| 4,272,743 | 6/1981 | Evans | 333/17 R X |
| 4,348,770 | 9/1982 | Ito | 455/164 |

FOREIGN PATENT DOCUMENTS

720704  3/1980  U.S.S.R. ............. 333/17 R

*Primary Examiner*—Eugene R. Laroche
*Assistant Examiner*—Benny Lee
*Attorney, Agent, or Firm*—Lipton, Famiglio & Elman

[57] ABSTRACT

An electronic circuit utilizing a parallel tuned resonant circuit and time variant frequency multiplying to eliminate undesired response changes of the tuned circuit due to temperature is disclosed. The electronic circuit illustrated permits accurate measuring of the change of inductance in a parallel tuned circuit where such change of inductance is due to an input parameter to be measured. The inductive component being measured may be located in environmental conditions which include a large variation in ambient temperature. While normally such wide temperature variations may substantially interfere with the measurement of the value of the inductance in question, the disclosed invention provides for compensation of such undesired changes so that the actual change of the inductance can be monitored without interference. The invention utilizes a dual frequency clock oscillator and a time selective system to alternatively select a high or low frequency input to the parallel tuned resonant circuit, and includes two sample and hold components operating in conjunction with the time selected frequency input of the circuit.

4 Claims, 8 Drawing Sheets

TIME-FREQUENCY MULTIPLEXING SYSTEM FOR CORRECTING OUTPUT AMPLITUDE OF A TUNED CIRCUIT DUE TO IMPEDANCE DRIFT

SUMMARY OF THE INVENTION

The disclosed invention presents a method for correcting changes in the impedance of an electronic tuned circuit which are a result of environmental changes. The disclosure illustrates a two pole electronic tuned circuit, commonly referred to as an RLC circuit, with associated time multiplexing frequency generation means to drive the RLC circuit. A parallel RLC circuit displays a characteristic such that the impedance of a parallel RLC circuit is maximum at its designed resonant frequency. If a parallel RLC circuit is driven either above or below its characteristic resonant frequency, the voltage drop across that parallel resonant circuit will decrease with such frequency excursions, since the impedance through the circuit has been reduced accordingly. The disclosed invention utilizes the voltage drop of a tuned circuit above and below its resonant frequency, to change the inductance of the tuned circuit. The change in inductance of the tuned circuit may be due to the influence of a parameter to be measured. For example, the change in the core permeability of an inductance in a tuned circuit may represent a desired parameter to be measured. The change in inductance of the tuned circuit necessarily alters the output of that tuned circuit when driven at a given frequency. Since a change in the resistive component of an RLC circuit also changes the output at any given frequency, it is desirable to factor out any resistance change so that the measured change in can be measured accurately without such error. The resistance change in a tuned circuit is most commonly caused by temperature drift.

The disclosed invention utilized a two frequency clock oscillator selected to alternatively, in time, drive the RLC circuit at a frequency higher than the center frequency, and a frequency lower than the center frequency so that the voltage drop caused by the RLC circuit can be measured alternately at each frequency. The present invention includes an error reduction system which also measures the undesirable resistance change of the RLC circuit in a fashion such as to allow cancellation of such resistance change so that only the change in inductance will be accurately measured.

It is the principal object of the present invention to provide an electronic circuit for error correction to measure the change in the inductance of an RLC circuit while eliminating any error in measuring such inductance change which may be due to undesired resistance change in the tuned circuit.

DETAILED DESCRIPTION OF THE INVENTION

The present invention is a method of determining, and correcting for, error and drift in a resonant RLC circuit which may be caused by temperature or other physical or environmental changes. The circuit, in it operation which will be described below, has many applications, and may be utilized in conjunction with other apparatus utilizing a two pole resonant electrical circuit which requires stability, over time, of the frequency of the circuit in question.

It is well know that a parallel RLC network has a resonant frequency which approximated by the relation $$f_0 = \frac{1}{2\pi \sqrt{LC}}.$$

In such a parallel RLC network, the impedance of such a network, as measured across the network, is at a maximum at the resonant frequency of the network. When such a parallel resonant circuit is driven by a constant current, the voltage developed across the network reaches a maximum when the network is driven at the network's resonant frequency as described by the equation above.

Figure 2:
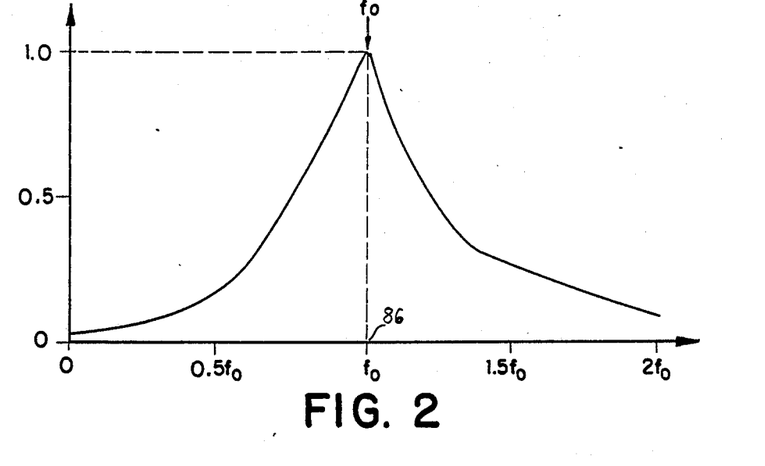
FIG. 2 is a graph representation of the frequency response of a parallel tuned circuit, plotted with voltage amplitude across the tuned circuit on the Y axis and the drive frequency being applied to the circuit represented on the X axis.

FIG. 2 illustrates a well known frequency response curve of an RLC network. The resonant frequency of the network is represented as $f_0$, shown as 86 on FIG. 2. As the driving frequency of the circuit is increased or decreased above or below point 86, it will be appreciated that the voltage measured across such a network decreases.

If the parallel resonant circuit were to be driven at a frequency other than its resonant frequency $f_0$, shown at 86, the voltage measured across the network will be lower than the maximum value found at the resonant frequency. This would be the case regardless of whether the drive frequency was above or below the resonant frequency $f_0$, shown at 86.

Figure 3:
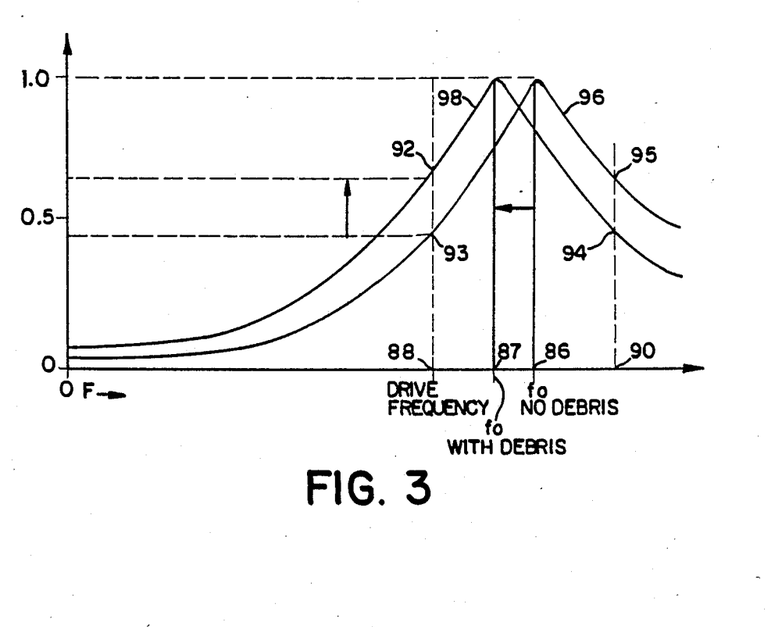
FIG. 3 is a graph representation of the frequency response of a parallel tuned circuit, for two different values of components in the tuned circuit. The frequency response curve shown in FIG. 3 represent the same tuned circuit with the resonant frequency shifted downward due to the change of the inductance.
Figure 4A:
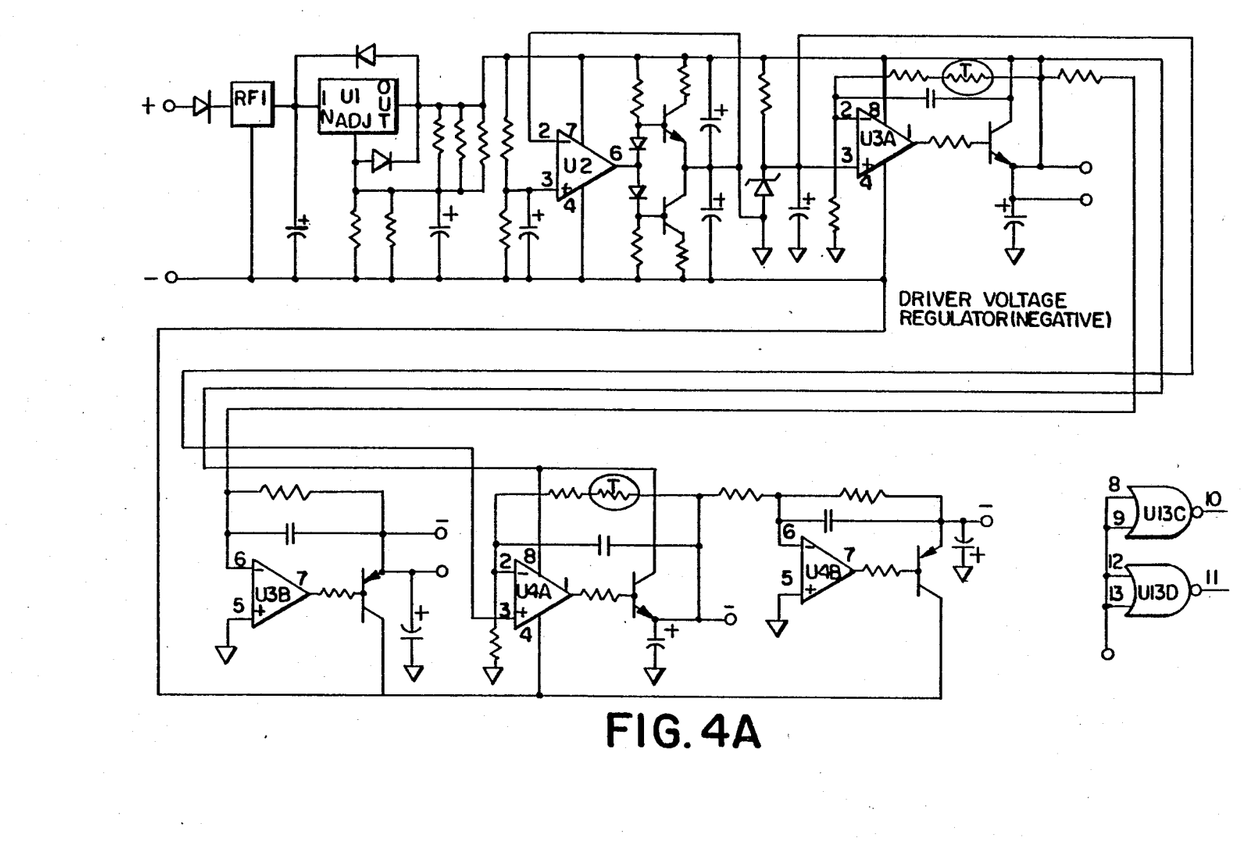
FIGS. 4A–4F are sections of an electronic schematic diagram illustrating electronic component placement and selection for the preferred embodiment of the present invention.
Figure 4B:
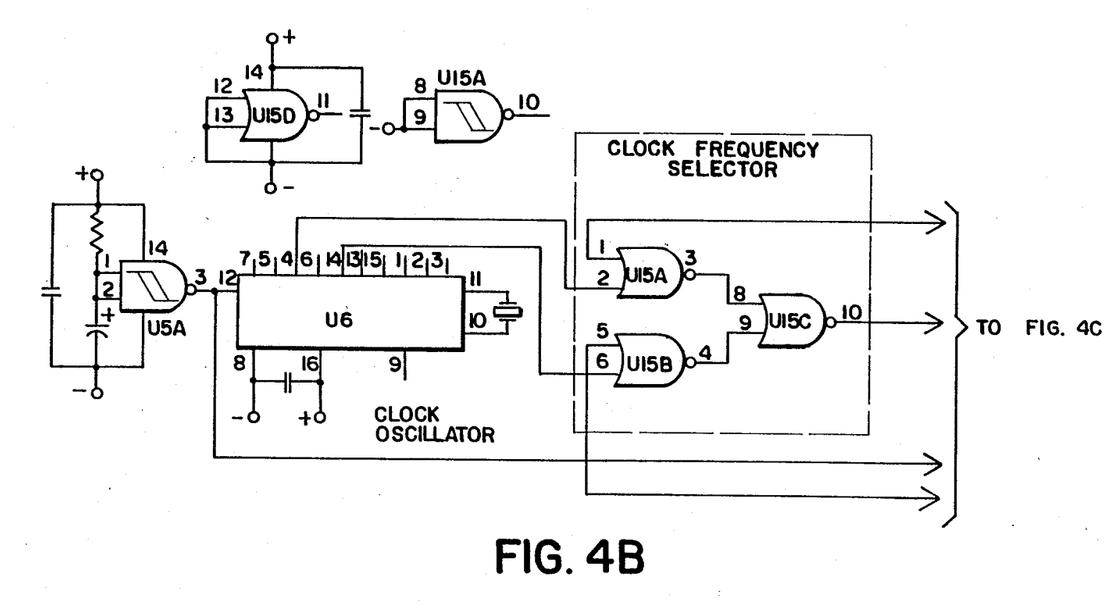
Figure 4C:
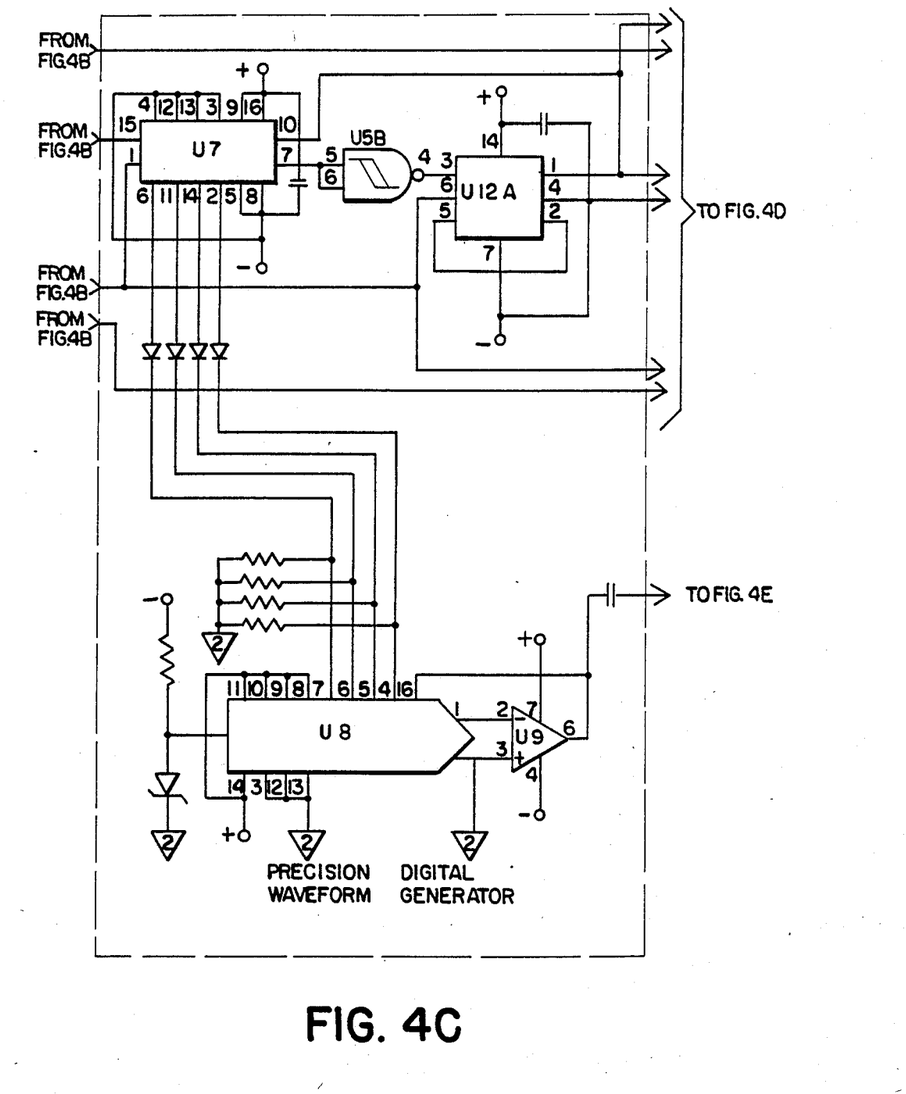
Figure 4D:
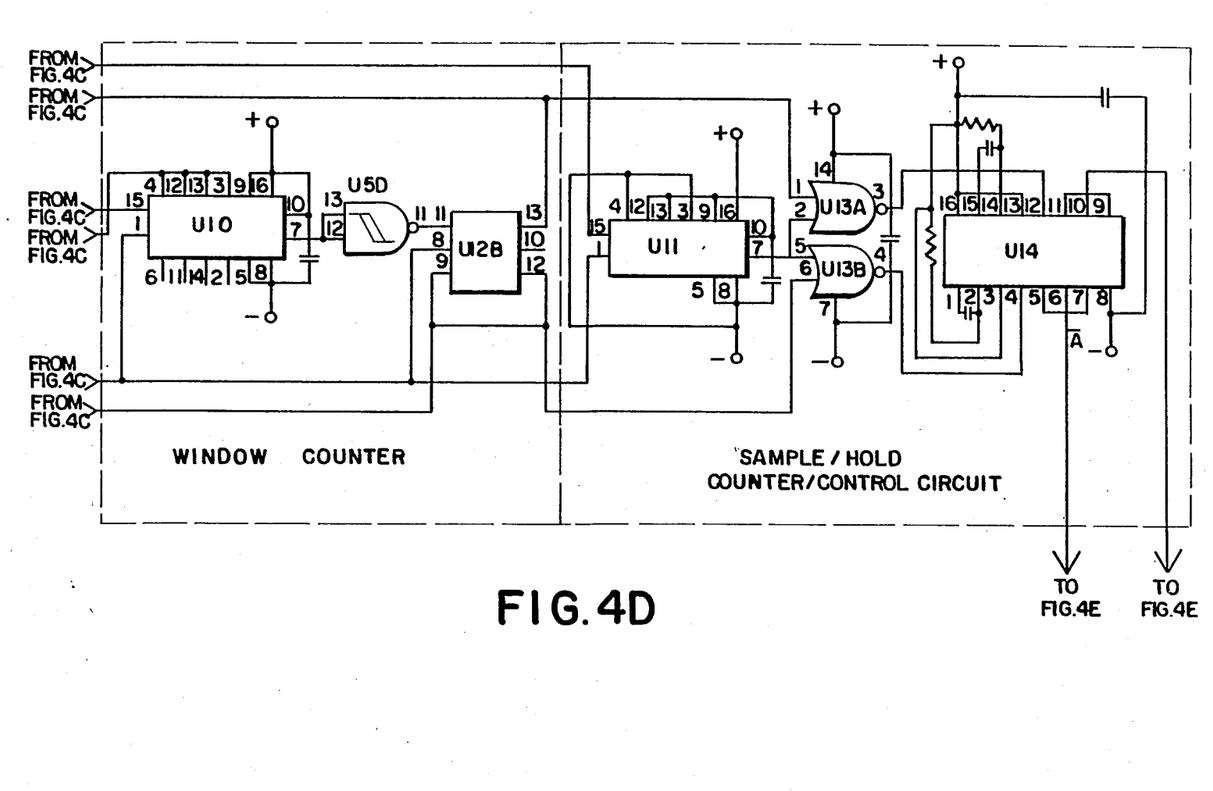
Figure 4E:
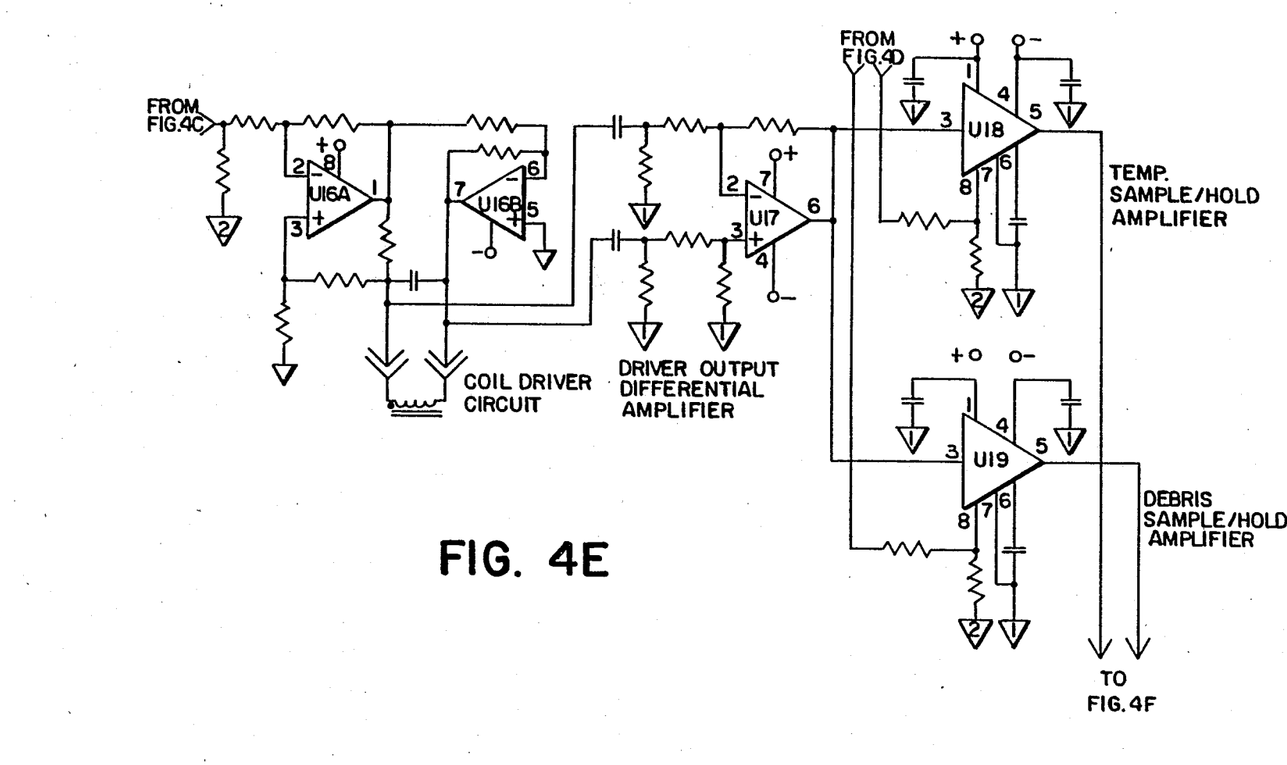
Figure 4F:
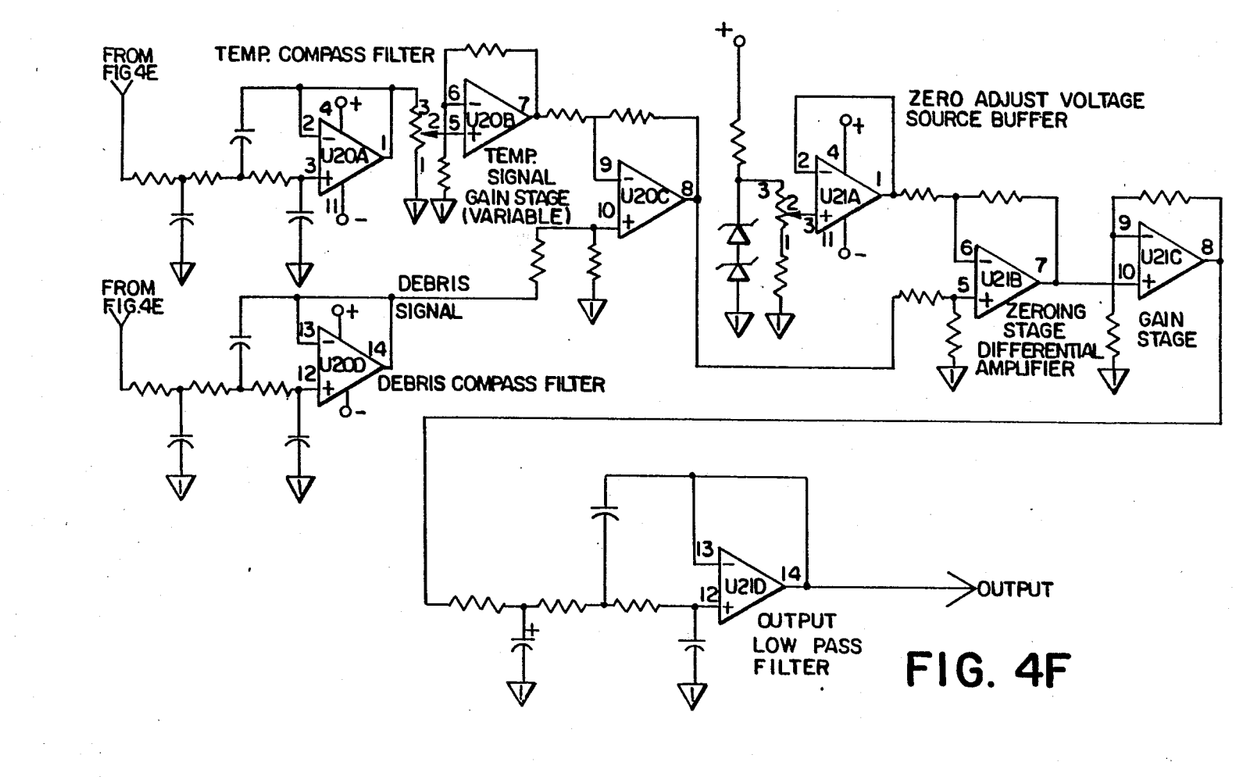

Turning to FIG. 3, the change in the voltage amplitude vs. frequency is depicted by two curves, 96 and 98, superimposed on the same graph. The two curves shown illustrate the same frequency response of the RLC network. However, curve 98 has been shifted slightly in frequency by a change in the value of either the capacitance or inductance which comprises an RLC network. If the inductance of the RLC network were to change, due to the change in the value of the core of the inductor L, or a variation of the inductor L in some other fashion, such as an input parameter increasing the value of the inductor, the resonant frequency of RLC network would shift from $f_0$ shown at 86 to $f_0$ shown at 87. If the RLC network was being driven at a frequency $f_1$, shown at 88 on FIG. 3, it will be appreciated that a shift in the resonant frequency of the network being measured from 86 to 87 will cause an increase in voltage across such a network. The voltage measured across the network with resonant frequency 86, when driven at a drive frequency below resonance depicted by 88, would be measured to be a value shown as 93 on FIG. 3. If the resonant frequency of the RLC network were to be shifted to a frequency value shown as 87 on FIG. 3, the voltage measured across the RLC network would increase to value 92 shown on FIG. 3. Similarly, if the RLC network being measured were driven at a frequency 90 higher than its resonant frequency 86, the voltage across the network would be less than maximum as shown at 95 on FIG. 3. If the RLC network resonant frequency were to be shifted downward to frequency 87, the voltage across the RLC network would decrease to value 94. In summary, given a drive frequency below resonance 88, and a drive frequency above resonance shown at 90, the voltage across the RLC network, when such resonant frequency is shifted downward would increase at frequency 88 and decrease at frequency 90.

If the change in voltage amplitude at frequency 88 and 90 shown in FIG. 3 is measuring a certain parameter or value in a control circuit, it is desirable to have such a change occur only in response to such a control input, and not due to other external parameters, such a temperature. It is well known that a temperature variation in an electronic component can and will cause a change in the components designed parameters. Frequently these undesirable environmental changes are sufficient to cause a substantial error in the parameter being measured through the change of such component, such as the resistive component in the RLC network. In the preferred embodiment of the present invention, the value of inductor L in the resonant circuit is altered by an increase in the permeability of the core of L. Such an increase in permeability, causing a corresponding increase in the inductance value of L, is related to an external parameter being measured. Assuming the change in inductance is to be measured by measuring the voltage change across a resonant network, while driven at a given frequency, any voltage change across that network caused by some other parameter would be undesirable. Using change in the reactance of an RLC circuit due to temperature, and assuming that such temperature changes are undesirable as interfering with the desired control input change of L, the present invention offers a system to correct for this assumed undesirable first order change due to temperature. The electronic circuit described teaches a method which factors out any change in the voltage vs. frequency response of an RLC circuit, driven at a given frequency, by factors other than the actual desired change due to the control input.

For the purpose of the description of the preferred embodiment of the present invention, it will be assumed that the error to be corrected is a change in the resistance due to temperature, and that the compensation desired is temperature compensation. It would be appreciated that other errors can be corrected in a similar fashion. The compensation method utilized in the present invention is the time multiplexing of two frequencies, described earlier and illustrated on FIG. 3 as frequency 88 and frequency 90, being above and below the resonant frequency of the RLC network, either 86 or 87 as shown on FIG. 3. By driving the RLC network alternatively in time, at frequency 88 or frequency 90, at predetermined lengths of time, the voltage across the RLC network can be measured during each event. The voltage change across the network will be in opposite directions if such change is due to a change in the resonant frequency from 86 to 87 as shown in FIG. 3. Such a change will cause the voltage across the network to increase from 93 to 92 at frequency 88. As described earlier, the same change in resonant frequency from 86 to 87 would cause a decrease of voltage across the network from 95 to 94 at frequency 90 in FIG. 3. However, it will be appreciated that a change in the characteristic reactance of an RLC network, due to temperature, mainly alters the resistance which shifts the relative voltage amplitude across the network causing either an increase or decrease, but in a direction which is identical, whether driven at frequency 88 or 90. An increase in resistance, for example, of the RLC network will cause the voltage amplitude value of curve 96 and curve 98 to decrease at all values across the frequency axis in FIG. 3. Therefore, recognizing an increase or decrease in voltage across the network which is in the same direction, either at frequency 88 or at frequency 90, would allow such a change to be factored out from any voltage change which is due to altering the inductance value of the RLC circuit. The present invention discloses a method for measuring such changes.

Figure 1:
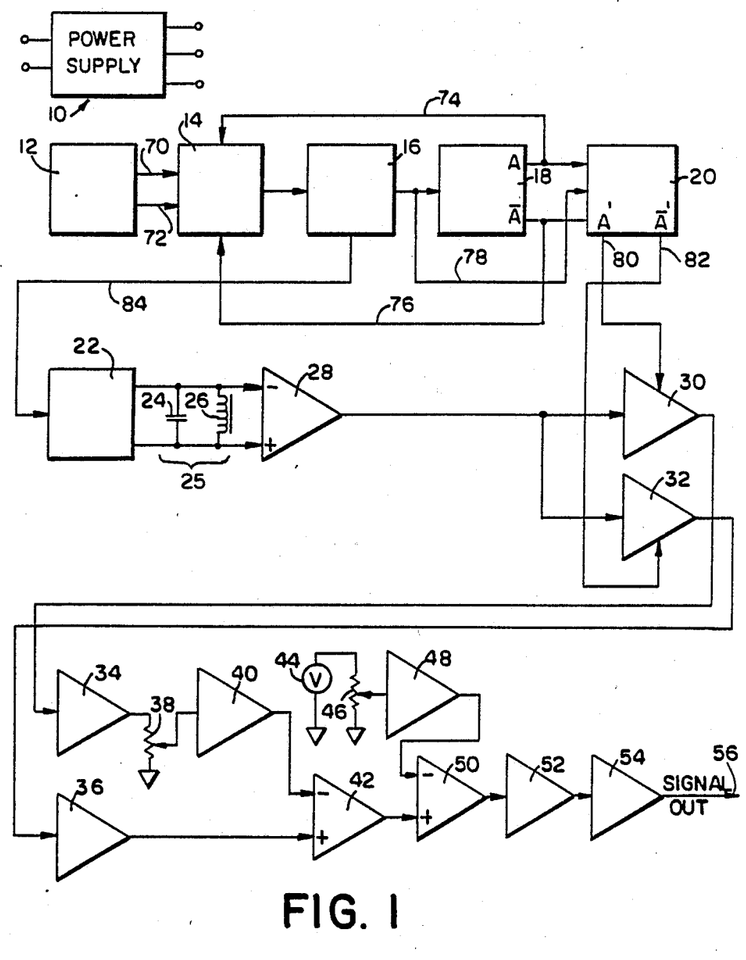
FIG. 1 is an electronic block diagram illustrating the major components of the invention, and is a simplified illustration of the schematic diagram found in FIG. 4.

Turning now to FIG. 1, a specific and preferred embodiment of the present invention will be described. FIG. 1 depicts a complete system for filtering the undesirable first order changes described to the extent that a signal output presented by the system depicted in FIG. 1 will represent only the desired change in inductance of a parallel RLC network under measurement.

In FIG. 1, a clock oscillator 12 is designed to operate at two frequencies, corresponding to lower frequency 88 and higher frequency 90 shown on FIG. 3. The high frequency 70 of the clock oscillator is introduced into the clock frequency selector 14. In a similar fashion, the low frequency signal from clock oscillator 12 is introduced into clock frequency selector 14 through line 72. The clock frequency selector 14 is controlled by selection input paths 74 and 76 which will be described below. It will be appreciated that clock frequency selector 14 is a switch which selects either the high frequency 70 or low frequency 72. The output of 14 is introduced into a precision digital waveform generator 16 which has two outputs, one of which is introduced into a window counter 18 and the other which is introduced into a coil driver circuit 22 through path 84. Window counter 18 is a timing device which controls clock frequency selector 14 through paths 74 and 76. The waveform generator 16 driving window counter 18, in effect, controls the switching of window counter 18 to select the high frequency output of clock 12 or the low frequency output of clock 12. An output of the precision digital waveform generator 6 is also introduced through path 84 into the coil driver circuit 22 which, in the preferred embodiment, is a Howland constant current source. The output of generator 16 through path 84 is not actually the same frequency as the clock oscillator 12 outputs at 70 or 72. Output 84, while necessarily proportional in frequency to output 70 or 72, is of a lower frequency and is switched in accordance with whether selector 14 has selected output 70 or 72. For the operation of the present invention, it is important that driver circuit 22 is a constant current source to avoid other undesirable voltage changes across network 25 and the design and construction of such is well known to those skilled in the art.

The RLC network described earlier is shown as 25 in FIG. 1. Essentially, capacitor 24 is in parallel with inductor 26. In such circuits, there is always inherent resistance across both capacitor 24 and inductance 26 although it is not shown in the system diagram on FIG. 1. Such a resistance may be the internal resistance of the components or an implied resistance, by design, across such circuit 25. The output of the RLC circuit 25 is introduced into a driver output differential amplifier 28. The output of amplifier 28 is a signal representing the change in voltage across the input of amplifier 28, which itself represents the change in voltage across the RLC Circuit 25. The output of 28 is introduced both into sample and hold amplifier 30 and sample and hold amplifier 32. As can be seen in FIG. 1, the sample and hold amplifier 30 is controlled by counter control 20 through path 80. In a similar fashion, sample and hold amplifier 32 is controlled through path 82 by the control counter 20. The sample and hold amplifier that is operating at any one particular time is a function of whether the high frequency of clock 12 or the low frequency of clock 12 is being selected. The window counter 18 controls sample and hold counter control 20. As the frequency input to the system, either the high frequency 70 or the low frequency 72, is alternatively selected in time, it will be appreciated the either the sample and hold amplifier 30 will be operating or sample and hold amplifier 32 will be operating. In this method, the output of 28 can be measured for both the low frequency signal and the high frequency signal. The output of amplifier 32 represents the output of the desired measured change of the inductance 25, representing the voltage drop across the RLC circuit 25 for a low drive frequency 72, also represented in FIG. 3 at 88. The output of 32 is introduced into a low pass filter 36 which is utilized to remove noise and other extraneous signals which may be generated because of the switching process inherent in the system described. The output of the low pass filter 36 is introduced into differential amplifier 42 which compares such input with the error signal being introduced into the inverting input of amplifier 42 as will be described below.

Returning to the remaining sample and hold amplifier 30, this amplifier samples and holds the output from differential amplifier 28 when commanded by the counter control 20 through line 80. This sample and hold amplifier 30 is commanded to operate during the period of time when clock 12 is generating a high frequency.

The output of amplifier 30 is introduced into a low pass filter 34 which, similar to the low pass filter 36, is utilized to filter noise and other extraneous inputs generated through switching transients and the like. The output of the low pass filter 34 is introduced into amplifier 40, whose gain is controlled through input level adjustment found through potentiometer 38. It will be appreciated that amplifier 40 can be utilized to amplify the error signal introduced out of low pass filter 34 to a suitable level for introduction into the inverting input of differential amplifier 42.

Returning to the operation of window counter 18 as it relates to sample and hold counter control 20, it is shown in FIG. 1 that the output of the waveform generator 16 is introduced through path 78 directly into counter control 20. Window counter 18 is a device which alters its output between one of two possible states as shown in FIG. 1. Specific details are set forth in the schematic diagram in FIGS. 4A–4F, but the operation of such a counter is well known to those skilled in the art. In the preferred embodiment, window counter 18 is designed with component values such as to switch states after a certain number of waveform periods have been counted at its input. Counter 18, in the preferred embodiment, switches states after experiencing 256 full periods of the input waveform being introduced to counter 18 by generator 16. When counter 18 has counted 256 full waveform periods, it changes its output state so as to command frequency selector 14 to select either the high frequency 70, or counter 18, alternatively, would select its alternate state so as to command selector 14 to select a low frequency 72 by sending its command signal through path 76 as shown in FIG. 1. In a similar fashion, counter 18 commands counter control 20 to select either sample and hold amplifier 30 when window counter has selected high frequency 70, or sample and hold amplifier 32 when window counter 18 has selected low frequency 72. At the same time, counter control 20 monitors the instantaneous amplitude of any waveform output of waveform generator 16 through path 78. In this manner, control counter 20 may be designed to control the sample and hold time of amplifier 30, or 32, to correspond with a particular instant in time of the waveform introduced through line 78.

In the preferred embodiment, since a negative temperature coefficient is desired in the disclosed design, amplifier 30 is commanded to sample the value of the waveform at an instant in time corresponding to the trailing edge of a given half cycle of the waveform. With respect to the triggering of amplifier 32, in the preferred embodiment counter control 20 is designed to trigger sample and hold amplifier 32 during the leading edge of the first half period of any given waveform.

Upon consideration of the block diagram in FIG. 1, it will be appreciated that, comparing a given period of a waveform presented through 78 to counter control 20, there will be a phase shift, at a given instant in time, between the waveform present through line 78 and the output of differential amplifier 28. This phase shift will either lead or lag the waveform presented through 78 in any instant in time depending on whether the frequency through line 78, being either high frequency 70 or low frequency 72, is above or below the resonant frequency of RLC circuit 25.

The temperature compensating function described in the preferred embodiment occurs because the desired change in inductance in L causes an increase in the amplitude of the output of amplifier 28, at frequency 88 less than the frequency 87, being lower in value than the starting resonant frequency $f_0$ at 86, and a decrease in the output of amplifier 28 when the RLC network is being driven at a frequency above resonance, shown by example at 90. However, the direction of change of the amplitude of the output of amplifier 28, with respect to an increase of temperature, will be the same regardless of whether frequency 88 or 90 is being selected. The control signals generated by counter controller 20 are designed so that both have either a positive or negative temperature coefficient, depending on the direction of error correction of the output of sample and hold 32 which is desired. In the preferred embodiment, a negative temperature coefficient was chosen although a positive temperature coefficient can be utilized by a minor change in the circuit design which can be accomplished by a simple change in a component value.

Returning to compensation differential amplifier 42, it will be appreciated that the output of this amplifier is the inductance signal, represented at the output of filter 36, minus the amplified error signal which is represented by the output of amplifier 40. In short, the output of 40 is subtracted from the output of 36. The effect of this operation is that the desired signal representing the change in inductance of the resonant circuit will be added together, since the signals are opposite and would arithmetically add. However, the voltage component inherent in the output of filters 34 or 36 which represents the error signal, by the design of the circuits shown, will have the same value sign and therefore, would cancel out.

Returning to FIG. 3 momentarily to describe this effect, it would be appreciated that a resistance change affecting the voltage drop across network 25, due to temperature, will reduce the output seen from amplifier 28 from the point represented by 92 slightly downward in the direction of point 93. At frequency 90, however, the output of 28 would decrease slightly from the voltage amplitude represented by 94, lower towards the F axis of FIG. 3. Through the circuit as described, this temperature change is cancelled out through the operation of amplifier 42, leaving only the output of 42 representing the value of the inductance change in the resonant circuit. The resultant desired signal, at the output of amplifier 42, is adjusted to zero through the use of a zeroing stage differential amplifier 50. It will be seen that a constant voltage source 44, the fixed magnitude of which can be varied by potentiometer 46, is introduced into a voltage source buffer 48. The output of buffer 48 is applied to the inverting input of differential amplifier 50 is such that the resting output of the disclosed circuit can be set to zero as may be desired. In this fashion, only actual changes in inductance L which result from the desired control input will be presented to gain stage 52, the output of which is introduced to a low pass filter. Low pass filter 54 removes noise and short term changes then produces the output signal 56 which is the desired signal, absent any undesired change due to temperature variation as described.

Finally, power supply 10 shown in FIG. 1 is of a conventional design, and is utilized to operate the various stages shown in FIG. 1 as may be required. In the preferred embodiment, a 28 volt input to power supply 10 produces various outputs, of 7.5 volts, either positive or negative as may be desirable. The design and operation of a power supply for operating an electronic circuit is well known to those skilled in the art and is not unique or specific to the present invention. Turning now to FIGS. 4A-4F, an actual schematic diagram of the circuit as constructed in the preferred embodiment is disclosed. The circuit shown operates on a 28 volt DC input nominal, has various discrete and integrated electronic components shown in its construction. The schematic diagram disclosed in FIGS. 4A-4F is a detailed description of the block diagram circuit set forth in FIG. 1.

Although the present invention has been described with reference to the particular embodiments herein set forth, it is to be understood that the present disclosure has been made only by way of example and that numerous changes in the details of construction may be resorted to without departing from the spirit and scope of the invention. Thus, the scope of the invention should not be limited to the foregoing specification, but rather only by the scope of the claims appended hereto.

What is claimed is:

1. An electronic circuit for correcting voltage amplitude response changes due to resistance in a tuned circuit comprising:

a clock oscillator means generating two discrete frequencies, one a high frequency and one a low frequency;

a frequency selection means to select, upon receiving a command, one of the two frequencies of the said clock oscillator;

a waveform generator;

a waveform period counter which switches between one of two states corresponding to said high frequency and said low frequency of said clock oscillator;

a sample and hold counter control operatively connected to said waveform period counter;

a first sample and hold amplifier;

a second sample and hold amplifier;

a constant current coil driver circuit driving a tuned circuit;

a first differential amplifier; and a second differential amplifier;

wherein said clock oscillator means is operatively connected to the frequency selection means, and said frequency selection means alternatively selects said high and low frequency from said oscillator means to introduce such frequency into the waveform generator, said waveform generator producing a frequency output proportional to said selected high or low frequency and introducing said proportional output to the said coil driver constant current circuit, and also to said waveform period counter;

wherein said constant current driver further provides a constant current to said tuned circuit, said tuned circuit having an output being placed across the inputs of said first differential amplifier such that the output of said first differential amplifier represents the voltage across said tuned circuit;

the output of said first differential amplifier being introduced to the input of said first and second sample and hold amplifiers, said first sample and hold amplifier driving an inverting input of said second differential amplifier and said second sample and hold amplifier driving a non-inverting input of said second differential amplifier;

wherein said first and second sample and hold amplifiers are further commanded to sample and hold by said sample and hold counter control in a manner corresponding to said high frequency and said low frequency of said clock oscillator means.

2. The electronic circuit of claim 1 further including an adjustable voltage source and a third differential amplifier with a non-inverting input, said third amplifier non-inverting input operatively connected to the output of the second differential amplifier and said adjustable voltage source is connected to the inverting input of said third differential amplifier.

3. The electronic circuit of claim 2 wherein the output of said third differential amplifier is operatively connected to a further stage of amplification which provides low-pass filtering.

4. A method for correcting output amplitude in a tuned circuit due to a change in resistance, whereby said tuned circuit to be compensated is driven with a constant current at either a high or low frequency which is respectively above and below the resonant frequency of said tuned circuit;

said tuned circuit has an output which is then sampled and held alternately corresponding with the high frequency and with the low frequency;

wherein said high frequency has an amplitude value which, is algebraically subtracted from the sampled and held signal corresponding to the amplitude value of said low frequency signal yielding a signal which is indicative of only changes in said output amplitude which are due to a change in circuit parameters other than resistance of said tuned circuit.

* * * * *

UNITED STATES PATENT AND TRADEMARK OFFICE
CERTIFICATE OF CORRECTION

PATENT NO. : 4,906,950

DATED : March 6, 1990

INVENTOR(S) : Nicholas P. Maris and Charles Montague

It is certified that error appears in the above-identified patent and that said Letters Patent is hereby corrected as shown below:

Column 7, line 34, after the words "low pass filter" which appear in the beginning of the sentence, the numeral "54" should be inserted.

Claim 4, column 10, line 2, after the words "other than", the word "the" should be inserted.

Signed and Sealed this

Ninth Day of June, 1992

*Attest:*

DOUGLAS B. COMER

*Attesting Officer*  *Acting Commissioner of Patents and Trademarks*